US006879004B2

(12) United States Patent
Leung et al.

(10) Patent No.: US 6,879,004 B2
(45) Date of Patent: Apr. 12, 2005

(54) HIGH VOLTAGE DIFFERENCE AMPLIFIER WITH SPARK GAP ESD PROTECTION

(75) Inventors: Ka Y. Leung, Austin, TX (US); Douglas R. Holberg, Wimberley, TX (US)

(73) Assignee: Silicon Labs CP, Inc., Austin, TX (US)

( * ) Notice: Subject to any disclaimer, the term of this patent is extended or adjusted under 35 U.S.C. 154(b) by 43 days.

(21) Appl. No.: 10/288,188

(22) Filed: Nov. 5, 2002

(65) Prior Publication Data

US 2004/0084729 A1 May 6, 2004

(51) Int. Cl.[7] .............................................. H01L 23/62
(52) U.S. Cl. ...................................... 257/363; 257/536
(58) Field of Search ................................ 257/356, 358, 257/360, 363, 536, 537, 538

(56) References Cited

U.S. PATENT DOCUMENTS

| | | | | |
|---|---|---|---|---|
| 5,656,530 A | * | 8/1997 | Leary | 438/639 |
| 5,990,519 A | * | 11/1999 | Huang-Lu et al. | 257/357 |
| 6,084,759 A | * | 7/2000 | Hansson et al. | 361/111 |
| 6,215,251 B1 | * | 4/2001 | Orchard-Webb | 315/209 M |
| 6,323,599 B1 | * | 11/2001 | Orchard-Webb | 315/209 M |
| 6,493,198 B1 | * | 12/2002 | Arledge et al. | 361/56 |
| 2002/0151200 A1 | * | 10/2002 | Fauser et al. | 439/181 |
| 2003/0089979 A1 | * | 5/2003 | Malinowski et al. | 257/724 |

* cited by examiner

*Primary Examiner*—Stephen W. Smoot
(74) *Attorney, Agent, or Firm*—Howison & Arnott, L.L.P.

(57) ABSTRACT

A spark gap device for protecting an integrated circuit. The spark gap device includes a first node for receiving an input signal and a second node to be protected. A first conductive layer is conductively interfaced to the first node and the second node and disposed therebetween. A second conductive layer is connected to a sink voltage and separated from the first conductive layer by an insulating layer of a predetermined thickness. A portion of the first conductive layer is disposed proximate to the second conductive layer and not overlying the second conductive layer, such that a gap is formed therebetween and the gap having a dimension that is greater than the thickness of the insulating layer.

22 Claims, 6 Drawing Sheets

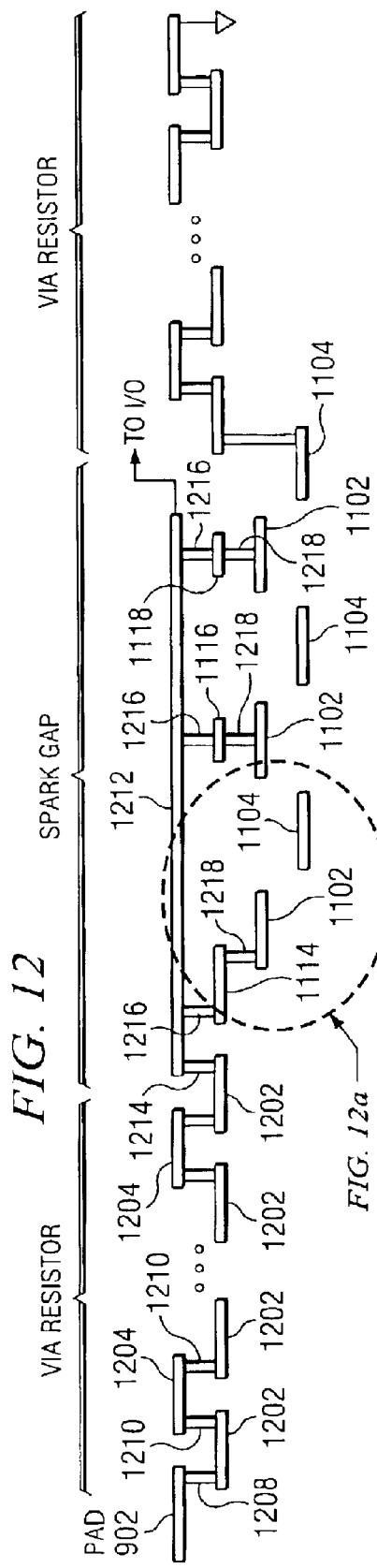
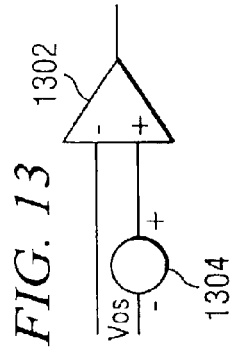
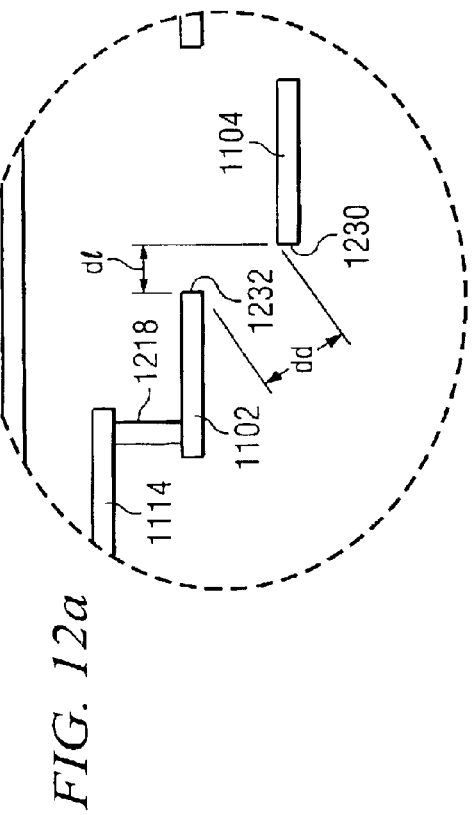
FIG. 12
FIG. 12a
FIG. 13

HIGH VOLTAGE DIFFERENCE AMPLIFIER WITH SPARK GAP ESD PROTECTION

TECHNICAL FIELD OF THE INVENTION

The present invention pertains in general to a spark gap Electrostatic Discharge (ESD) protection and, more particularly, to a spark gap ESD that is fabricated between two conductive layers separated by an insulating layer.

BACKGROUND OF THE INVENTION

Spark gaps have been utilized for the purpose of providing electrostatic protection from input voltages that exceed the voltage specification of the electronic circuitry on integrated circuits. In current technology, advances in the manufacturing technology for semiconductor devices has provided devices that operate on very low voltages, typically 3.0 Volts or lower in most applications. The reason for this is to facilitate operation on only two cells of a battery, or even a single 1.5 Volt cell. However, a problem arises when high input operating voltages that exceed the voltage specification of the integrated circuit are impressed across different terminals of the part in the normal operating mode thereof. To reduce the voltages at the input to the integrated circuit, an attenuator is placed on the input reduce the input voltage swing with some type of resistive divider circuit, and then the common mode voltage is reduced to a workable range. However, when these input voltages exceed the breakdown voltage of the circuitry utilized for the attenuator, more robust protection is required. These overvoltage conditions can cause damage to the integrated circuit that is typically attached to an input terminal via the resistive divider circuits. If this voltage exceeds the operating voltage for the integrated circuit, the circuit will fail. One solution has been to utilize spark gap Electrostatic Discharge (ESD) protection device that provides for a device that shunts current resulting from a high voltage spike to ground. This is typically a destructive operation that destroys the spark gap but does protect the integrated circuit for that particular spike. Present systems for realizing spark gaps as an ESD device utilize metal layers in the integrated circuit that are disposed on the same level and disposed a small distance apart, such that the voltage will cause a current "arc" across the gap, which shunts current to ground and subsequently destroys the gap due to the breakdown associated with the arcing.

SUMMARY OF THE INVENTION

The present invention disclosed and claimed herein, in one aspect thereof, comprises a spark gap device for protecting an integrated circuit. The spark gap device includes a first node for receiving an input signal and a second node to be protected. A first conductive layer is conductively interfaced to the first node and the second node and disposed therebetween. A second conductive layer is connected to a sink voltage and separated from the first conductive layer by an insulating layer of a predetermined thickness. A portion of the first conductive layer is disposed proximate to the second conductive layer and not overlying the second conductive layer, such that a gap is formed therebetween and the gap having a dimension that is greater than the thickness of the insulating layer.

BRIEF DESCRIPTION OF THE DRAWINGS

For a more complete understanding of the present invention and the advantages thereof, reference is now made to the following description taken in conjunction with the accompanying Drawings in which:

FIG. 12 illustrates a cross sectional view of the spark gap array along the longitudinal axis;

FIG. 12A illustrates a detail of one of the spark gap devices in cross section;

FIG. 13 illustrates a diagrammatic view of each of the amplifiers showing the offset voltage associated therewith;

DETAILED DESCRIPTION OF THE INVENTION

Figure 1:
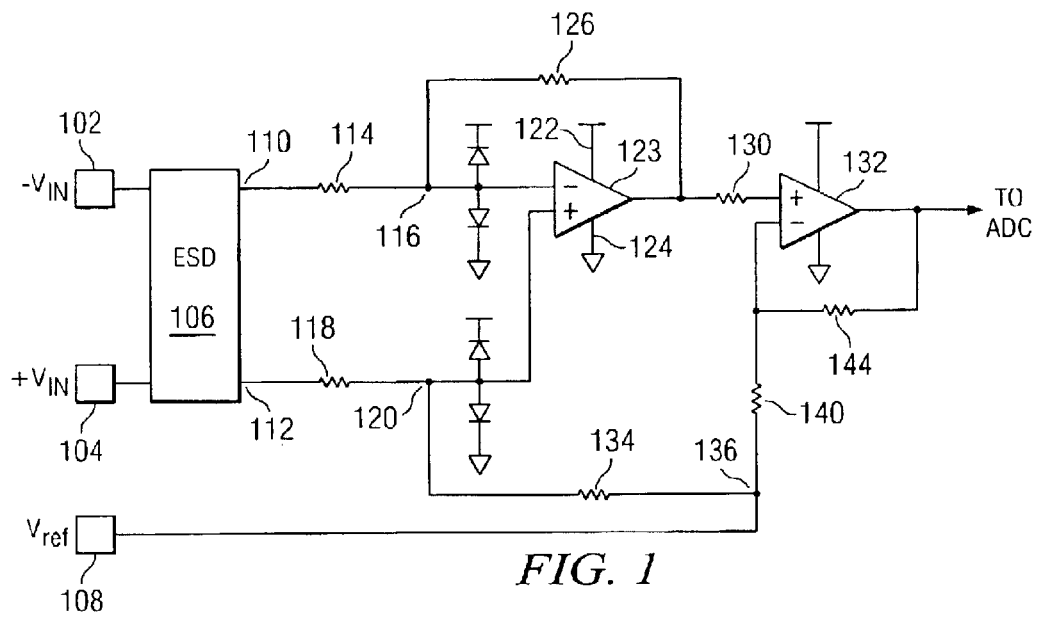
FIG. 1 illustrates a diagrammatic view of a difference amplifier utilizing the ESD spark gap of the present disclosure.

Referring now to FIG. 1, there is illustrated a diagrammatic view of a difference amplifier that utilizes the electrostatic discharge (ESD) spark gap of the present disclosure. An integrated circuit includes the difference amplifier and has two input terminals or pads 102 and 104 each for receiving the difference voltages $-V_{IN}$ and $+V_{IN}$, respectively. These voltages in this embodiment have a voltage range or swing of ±60 Volts, but any high voltage level can be present as the operating voltage range. The signal on the input of the two terminals 102 and 104 are processed through an ESD device 106 to protect against high voltage spikes during an ESD event. Although illustrated in a single block, the ESD device 106 typically provides an ESD for each terminal 102 and 104, as they are not covered. An additional terminal 108 is provided for receiving a reference voltage, $V_{ref}$. The ESD device 106 provides two outputs, one on the node 110 and one on a node 112. Node 110 is connected to one side of a series resistor 114, the other side thereof connected to a node 116. Node 112 is connected on one side thereof to a resistor 118, the other side thereof connected to a node 120. Node 116 is connected to the negative input of an amplifier 123, the positive input thereof connected to node 120. The amplifier 123 is connected to a supply on a supply terminal 122 and to ground on a terminal 124, it being noted that this supply voltage on node 122 is a finite level that is much less than the maximum rated input voltage swing. The node 116 is connected to one side of a feedback resistor 126, the other side thereof connected to the output of amplifier 123. The output of amplifier 123 is connected through a series resistor 130 to the positive input of an amplifier 132. Node 120 is connected through a series resistor 134 to anode 136, which node 136 is connected to the V$_{ref}$ terminal. Node 136 is also connected through a series resistor 140 to the negative input of the amplifier 132. The negative input of amplifier 132 is connected through a series resistor 144 to the output thereof.

The resistors 114 and 118, in combination with the feedback resistor 126 and the amplifier 123, provide attenuation which, in the present disclosure, provides a gain reduction of twenty. The reason for this is that the input is set to voltage swing of ±60 volts wherein the output swing for amplifier 123 on the output thereof will therefore be limited to 3.0 Volts. In order to center this about a 1.5 Volt level, the V$_{ref}$ voltage on terminal 108 is set to a value of 1.5 Volts. Gain is provided with the amplifier 132, which gain is defined by the ratio of the resistor 144 and the resistor 140. This difference amplifier of FIG. 1 is a conventional structure, it being noted that the ESD device 106 is only required for voltages that exceed overvoltage conditions.

Figure 2:
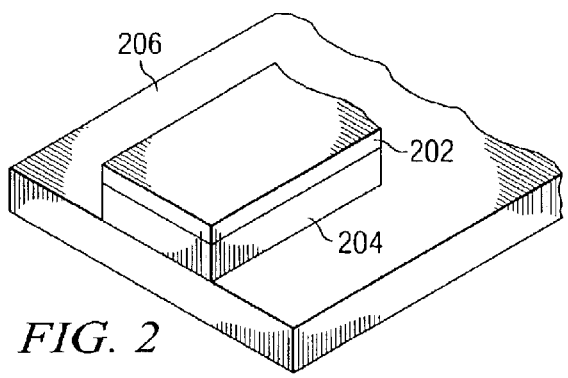
FIG. 2 illustrates an end view of the poly-R resistor that is disposed between the ESD device and the integrated circuit.

Referring now to FIG. 2, there is illustrated a diagrammatic view of a single layer of polycrystalline silicon 202 (Poly) disposed over a layer of oxide 204, the layer of oxide 204 disposed on an upper conducting surface 206. This is the configuration that can be utilized for simple Poly-R resistive loads or the such. For silicon dioxide, the electric field that will cause breakdown in silicon is equal to 6×10$^8$ v/m. Therefore, the thickness of the silicon dioxide layer 204 must be of such a thickness that it will withstand the high voltages in high voltage part. In the present disclosed embodiment, the voltage input to the part across terminals 102 and 104 in FIG. 1 will exceed ±60 Volts, such that the breakdown voltage must exceed 120 volts. In the present disclosed embodiment, the design is for breakdown voltage of approximately 220 volts, such that the input terminals will withstand this level of voltage before an ESD is required, as will be described in more detail hereinbelow.

Figure 3:
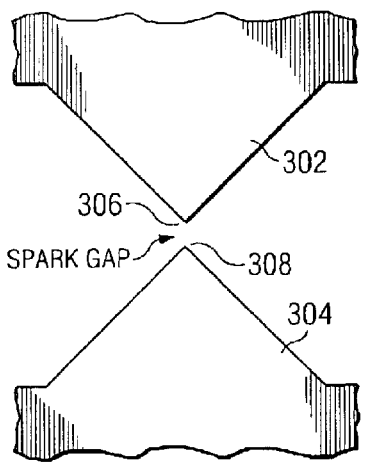
FIG. 3 illustrates a topical view of the spark gap.

Referring now to FIG. 3, there is illustrated a diagrammatic view of one terminal path through the ESD device 106, which is comprised of a plurality of spark gap devices. Each of the spark gap devices are configured of two conductive layers, a conductive layer 302 and a conductive layer 304 that are disposed, in the present embodiment, on different planes or layers. They are typically configured to have a corner on each layer, such as a corner 306 associated with layer 302 and a corner 308 associated with layer 304, these corners 306 and 308 disposed a predetermined distance apart. This distance, in conventional devices, can be separated by air or by silicon dioxide or some other material. The corners 306 and 308 allow the electric field to be concentrated at a point on the associated conductive layers 302 and 304, respectively. Another aspect of the spark gap device is that, when the electric field exceeds the breakdown of the medium in the gap between corners 306 and 308, current will flow across the gap, thus limiting the maximum voltage between layers 302 and 304. Typically, this current will be such that the conductive material of layers 302 and 304 proximate to the corners 306 and 308 will heat up sufficiently to destroy the spark gap and widen the distance between layers 302 and 304.

Figure 4:
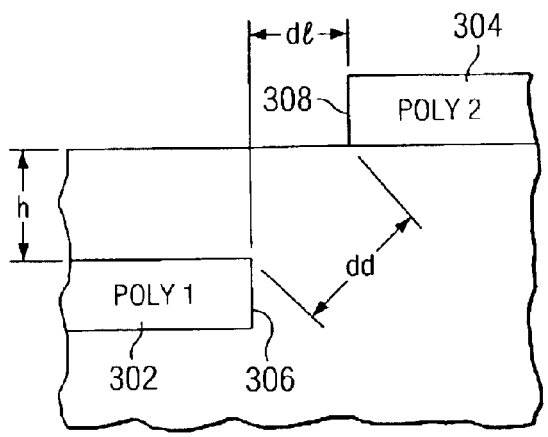
FIG. 4 illustrates a side view of the two layers associated with the spark gap.

Referring now to FIG. 4, there is illustrated a diagrammatic view of the spark gap. In the disclosed embodiment, the layer 302 is a lower layer fabricated from, for example, the first layer of Poly, i.e., the Poly 1 layer. The layer 304 is fabricated from a second layer of Poly, the Poly 2 layer. The Poly 1 and Poly 2 layers are fabricated in the integrated circuits for the purpose of forming other devices or other interconnecting layers. Therefore, the manufacturing process for those layers will be conventional and the layers 302 and 304 will have a conventional conductivity associated therewith, depending upon what structures are typically fabricated from those structures. For example, the Poly 1 layer is typically utilized to form transistor gates. It, therefore, will have a predetermined doping level to define the resistivity thereof. If necessary, the portion of the Poly 1 layer associated with the spark gap structure could have the resistivity thereof improved by siliciding all or a portion of this layer, although this is not necessary as the resistivity associated with transistor gates is at an acceptable level. However, at the Poly 2 layer, the resistivity may need to be reduced. This is accomplished by increasing the doping level in the portion of the Poly 2 layer associated with the spark gap ESD structure with a Poly 2 mask step followed by an implant step.

Typically, the Poly 1 and Poly 2 layers 302 and 304, respectively, will be separated by a predetermined distance with an insulating layer of oxide. This insulating layer of oxide, in the present disclosed embodiment, will have a thickness of approximately 380 Å. However, for silicon dioxide, the distance between the two layers 302 and 304 of 380 Å would not yield a sufficient electric field protection due to the thickness of the silicon layer if the two conductive layers 302 and 304 were disposed directly over each other— if so, the breakdown voltage would be only about 22 Volts. Therefore, the edges 306 and 308 of the layers 302 and 304 are separated by a distance "dl" in the horizontal plane and a distance "dd" along the diagonal. The distance "dl" is set to provide a nominal distance of 2,732 Å for the "dd" dimension, which results in a breakdown voltage of approximately 164 volts.

It can be seen that providing the layers 302 and 304 separated by the insulating oxide layer therebetween, alignment during manufacturing cannot result in a short. As the dimension "dl" decreases due to manufacturing tolerances, the result will be a decrease in the breakdown voltage. This will cause the spark gap to short at a lower voltage and destroy itself, but as will be described hereinbelow, multiple spark gaps are fabricated such that a decrease in the distance "dl" will result in an increase on the opposite side of the spark gap or another spark gap adjacent thereto.

Figure 5:
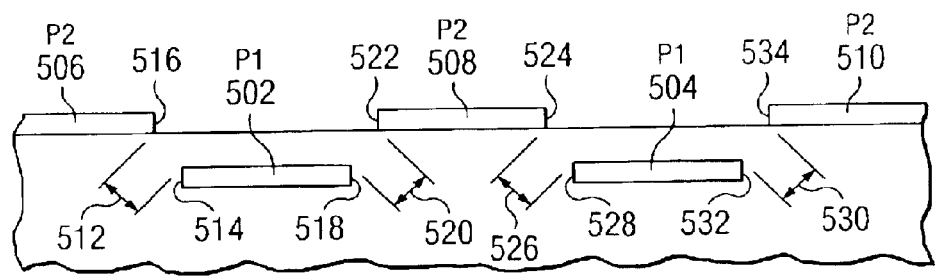
FIG. 5 illustrates a side view of multiple layers in the spark gap devices.

Referring now to FIG. 5, there is illustrated a cross sectional view of multiple spark gaps. There are illustrated two lower conductive layers 502 and 504, similar to layer 302 and formed in the Poly 1 layer. There are illustrated three upper conductive layers 506, 508 and 510, similar to layer 304 and formed in the Poly 2 layer. The vertical distance between the layers 502 and 504 and the layers 506–510 is substantially the same, since they are separated by a common layer of insulating material. However, the imaging techniques to form the Poly 1 and Poly 2 layers can have deviations due to manufacturing tolerances. The layer 502 has the layer 506 and 508 disposed on either side thereof, such that a spark gap 512 is formed between an edge 514 on layer 502 and an edge 516 on layer 506. Similarly, an edge 518 on the opposite side of layer 502 from edge 514 will have a spark gap formed between an edge and a spark gap 520 formed between edge 518 and an edge 522 on layer 508. On the opposite side of layer 508, an edge 524 will form a spark gap 526 with an edge 528 on layer 504. Layer 504 will form a spark gap with layer 510. A spark gap 530 is formed between an edge 532 on layer 504, opposite to edge 528, and an edge 534 on layer 510. It is noted that, if the mask for defining the Poly 2 pattern were shifted in any one direction, some of the spark gaps would decrease but the opposite side spark gaps would increase, thus either decreasing the breakdown voltage on some or increase in the breakdown voltage on others.

Figure 6:
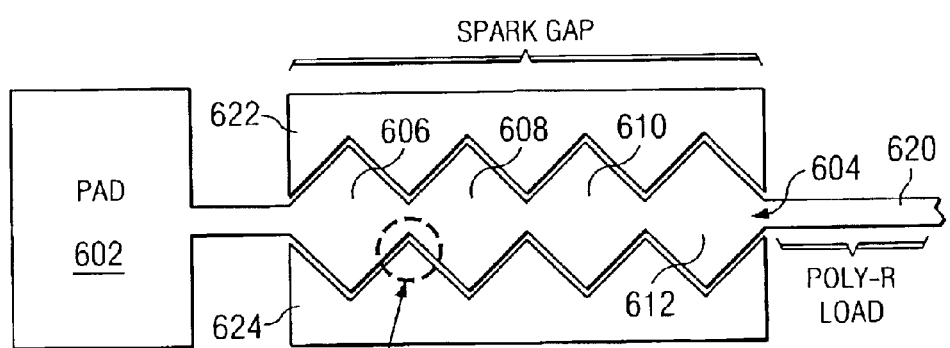
FIG. 6 illustrates a top view of a portion of the spark gap device.

Referring now to FIG. 6, there is illustrated a simplified diagrammatic view of the spark gap of the present disclosure. An input pad 602 is illustrated which is connected to a spark gap structure comprised of a plurality of sawtooth edges in a Poly layer 604—the Poly 2 layer. There are illustrated four "diamond shaped" structures 606, 608, 610 and 612. Each of the structures 606–612 has an apex on either side of the layer that extends from the pad 602 to a Poly-R load 620. On either side of the diamond shaped structures 606–612 is disposed a layer 622 on one side and a layer 624 on the opposite side, these being fabricated in the Poly 1 layer that is disposed on a different level than the layer 604, which is the Poly-2 layer. The relationship between the two layers results in a "sawtooth" configuration of spark gaps, there being a plurality of spark gaps along the edges of the diamond shaped structures 606–612 on either side thereof, as will be described hereinbelow. The purpose for providing a large number of spark gaps is that, when the electric field developed across a given one of the spark gaps exceeds the breakdown voltage thereof, it shunts current and is destroyed. The more spark gaps that are provided, the higher the number of overvoltage spikes that can be accommodated.

Figure 7:
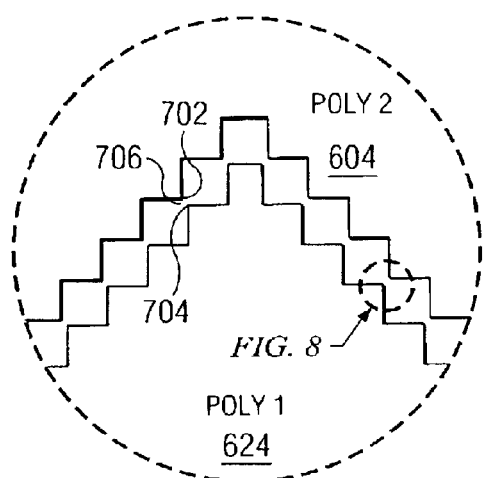
FIG. 7 illustrates a detail of a spark gap of FIG. 6.
Figure 8:
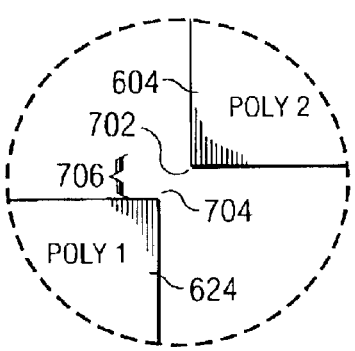
FIG. 8 illustrates a detail of the spark gap of FIG. 7.

Referring now to FIG. 7, there is illustrated a detail of one portion of the interface between the Poly 2 layer 604 and the Poly 1 layer 624. Each of the edges of the layers is constructed in a stair step manner such that there will be a plurality of outward extending corners 702 on the Poly 2 layer 604 and corresponding outward extending corners 704 on the Poly 1 layer 624 that will provide a spark gap 706 therebetween. The detail of the spark gap between these corners 702 and 704 is illustrated in FIG. 8.

Figure 9:
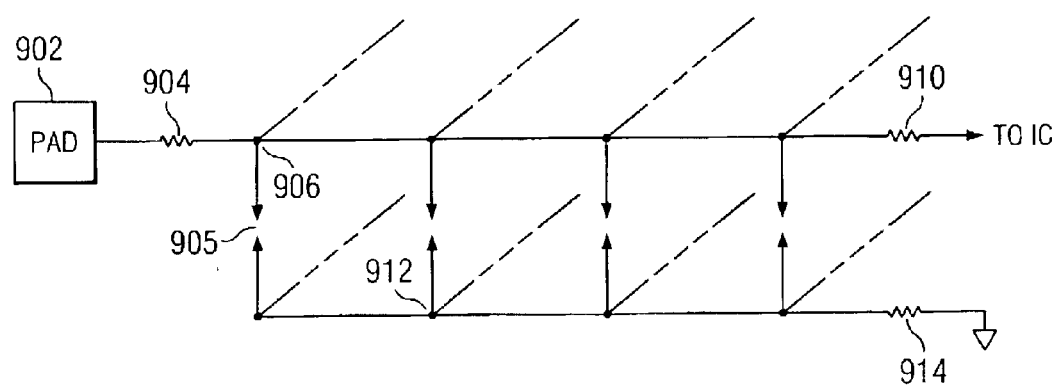
FIG. 9 illustrates a diagrammatic view of the spark gap devices as they are set forth in an array.

Referring now to FIG. 9, there is illustrated a diagrammatic view of the layout for the ESD device 106. For a single input, there is provided an external pad 902 which is connected through a first distributor resistor 904 to a node 906 providing a connection to one side of the spark gap devices. There are displayed a plurality of spark gap devices 905 having one side thereof connected to the node 906. The node 906 is a distributed node that extends from one side of the spark gap devices 905 and there across with the other side of node 905 connected to one side of a Poly R load resistor 910 that is input to one input of the amplifier 123. The other side of the spark gap devices 905 are all connected to a distributed node 912, which is connected through a distributor resistor 914 to ground. The spark gap devices 905 are laid out in a two dimensional array such that they extend in two directions, as will be described hereinbelow.

Figure 10:
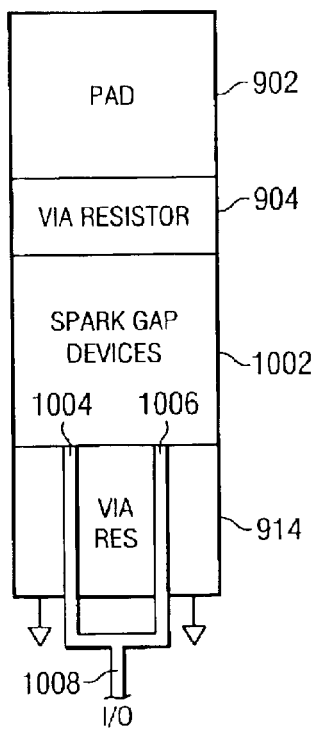
FIG. 10 illustrates a top view of the ESD device.

Referring now to FIG. 10, there is illustrated a top view of the layout. The pad 902 is connected through the resistors 904 to an array 1002 of spark gap devices which are disposed between the nodes 906 and 912. The distributed resistor 904 is comprised of a via resistor, which will be described hereinbelow. The spark gap devices 905 are disposed in a two dimensional array, as described hereinabove, such that the protection can be spread over a large area. The ground node 912 is connected through a distributed resistor 914 in the form of via resistors to ground. The spark gap devices at node 906 are connected through two conductive strips 1004 and 1006 to an I/O output 1008 and extending over the distributed resistor 914.

Figure 11:
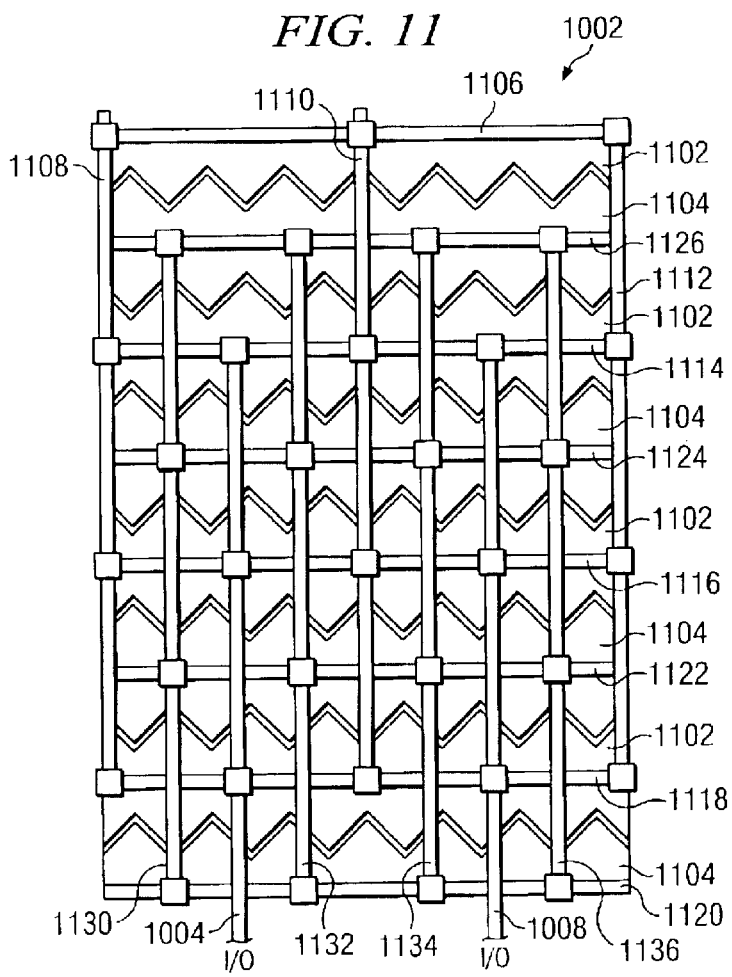
FIG. 11 illustrates a detail of the spark gap array.

Referring now to FIG. 11, there is illustrated a more detailed diagram of the array 1002. The array 1002 is comprised of a plurality of Poly 2 regions 1102 and a plurality of Poly 1 regions 1104. The distributed resistor 904 is connected to a horizontal metal run 1106 that is disposed along the edge of the array 1002 adjacent the distributed resistor section 904. There are four Poly 2 sections 1102 and four Poly 1 sections 1104. There are provided three longitudinal metal runs 1108, 1110 and 1112 that run along the length of the array 1102, two on one edge and one in the middle. The horizontal metal run 1106 is disposed along the Poly 2 section on the edge proximate the distributed resistor 904, with corresponding horizontal metal runs 1114, 1116 and 1118 disposed parallel thereto and extending along and connected to a respective one of the other three Poly 2 sections. Longitudinal runs 1108–1112 contact each of the Poly 2 regions 1102 that extend from the horizontal metal run 1106 to the other side of the array 1002 proximate the distributed resistor 914 and contact the metal runs 1114, 1116 and 1118. Each of these horizontal runs 1106 and 1114–1118 extend along each of the associated sections 1102 and contact each of the associated sections through vias thereto. For the I/O, the longitudinal runs 1004 and 1008 extend along the length of the array 1002 and connect to horizontal runs 1114, 1116 and 1118.

For the Poly 1 sections 1104 proximate the distributed resistor 914, there is provided a horizontal metal run 1120 along the edge adjacent the via resistor 914 and is connected to the associated Poly 1 section 1104 through vias. There are corresponding horizontal metal runs 1122, 1124 and 1126 associated with the remaining three Poly 1 sections 1104. There are provided longitudinal metal runs 1130, 1132, 1134 and 1136 that connect four horizontal runs 1120, 1122, 1124 and 1126 such that all of the Poly 1 sections 1104 are connected together through vias thereto. Each of the sections 1102 and 1104 are configured in accordance with the stair step layout illustrated above with respect to FIGS. 6, 7 and 8.

Referring now to FIG. 12, there is illustrated a cross sectional view of the array 1002. The pad 902 is formed in the upper metal 2 layer with a plurality of horizontal metal runs 1202 formed in the via resistor section 904, these provided in the metal 1 layer. In the metal 2 layer, there are provided a plurality of horizontal metal runs 1204 disposed between the spaced apart metal 1 horizontal runs 1202. The pad 902 is connected to the first of the horizontal runs 1202 in the metal 1 layer with a via 1208 and then there are a plurality of vias 1210 connecting the metal 1 horizontal runs 1202 to the metal 2 horizontal runs 1204. The last metal 1 horizontal run 1202 is connected to a longitudinal metal 2 run 1212 that is disposed in the spark gap region and constitutes one of the longitudinal metal runs 1108, 1110 or 1112. The last horizontal run 1202 proximate the array 1002 is connected to the run 1212 within the array 1002 with a via 1214. There are illustrated three of the horizontal runs 1106, 1114, 1116 and 1118, they being 1114, 1116 and 1118. Each of these horizontal runs is connected to the longitudinal run 1212 (this comprising one of the longitudinal metal runs 1108, 1110 or 1112,) through vias 1216. The horizontal runs 1114, 1116 and 1118 are formed in the metal 1 layer and are connected to the Poly 2 layer associated with the sections 1102 with vias 1218. The sections 1104 are disposed in the Poly 1 layer beneath the sections 1102 and disposed a predetermined distance therefrom to form the spark gap. A detail of the spark gap as illustrated in FIG. 12A, it being understood that the section detailed is that associated with the detail of FIG. 8. Although not shown, the sections 1104 are connected to associated ones of the horizontal metal runs 1126, 1124, 1122 or 1120 which are disposed in the metal 1 layers between the horizontal runs 1106, 1114, 1116 and 1118. The longitudinal runs 1130, 1132, 1134 and 1136 are parallel to the run 1212 and are not illustrated.

In FIG. 12A, it can be seen that the Poly 1 layer section 1104 is disposed at an edge 1230 a distance along a diagonal DD from an edge 1232 on the Poly 2 layer 1102. This is at the corner illustrated in the detail of FIG. 8.

Referring now to FIG. 13, there is illustrated a diagrammatic view of each of the amplifiers 123 and 132, referred to by a reference numeral 1302. Each of the amplifiers 123 and 132 have associated therewith on the positive input (or at least on one input) an offset voltage source 1304. This provides a voltage $V_{os}$. Since the two amplifiers are in series, the offset voltage will be additive by the following equation using resistor notations from FIG. 1:

$$V_{out} = \left[(V_1 - V_2)\frac{1}{20} + \frac{R_{114} + R_{126}}{R_{114}}(V_{OS1}) + V_{OS2}\right]\frac{R_{140} + R_{144}}{R_{140}}$$

where: $V_{out}$=output of amplifier 132
$V_1 = V_{in}$
$V_2 = -V_{in}$
$V_{OS1}$=offset of Amplifier 123
$V_{OS2}$=offset of Amplifier 132
1/20=closed loop gain of amplifier 123 and resistors 114, 118, 126 and 134.

In order to minimize the systematic offset, it is necessary to provide some offset cancellation. To facilitate this, the offset for each of the amplifiers 123 and 132 is set equal in magnitude and opposite in polarity, which will provide the offset minimization. This is illustrated in FIGS. 14 and 15.

Figure 14:
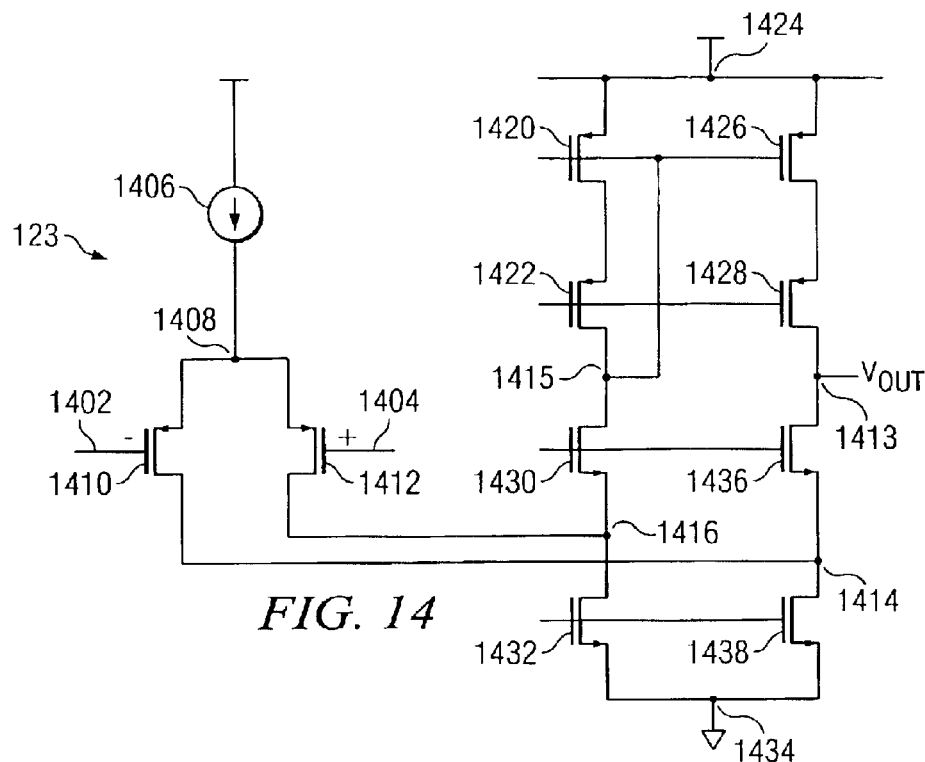
FIG. 14 illustrates a schematic diagram of one of the amplifiers.
Figure 15:
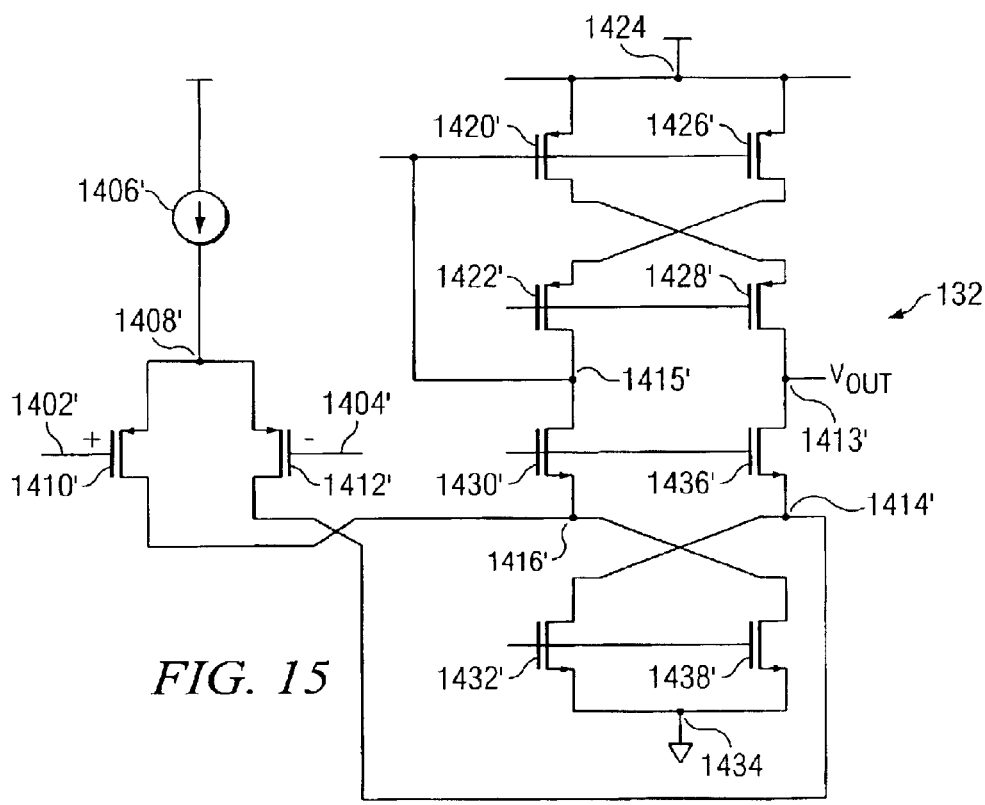
FIG. 15 illustrates a schematic diagram of the other of the amplifiers.

Referring now to FIG. 14, there is illustrated a schematic diagram of amplifier 123. The negative voltage is received on a node 1402 and the positive voltage on a node 1404. A current source 1406 provides current from a supply $V_{DD}$ to a node 1408. Differential input transistors 1410 and 1412 are connected such that the source/drain path thereof is connected on one side thereof at node 1408 and the gates thereof connected to nodes 1402 and 1404, respectively. The other side of the transistor 1410 is connected to a node 1414 and the other side of transistor 1412 is connected to a node 1416. Two P channel transistors 1420 and 1422 are connected in series between a power supply node 1424 and a node 1415. Two series connected P channel transistors 1426 and 1428 are connected between node 1424 and an output node 1413, the gates thereof connected to the gates of respective transistors 1420 and 1422. The gates of transistors 1422 and 1428 are connected to a bias voltage and the gates of transistors 1420 and 1426 are connected to node 1415. Two series connected N channel transistors 1430 and 1432 are connected between node 1415 and a ground node 1434, with node 1416 disposed therebetween. Two series connected N channel transistors 1436 and 1438 are connected in series between node 1413 and node 1434, with node 1414 disposed therebetween. The gates of transistors 1430 and 1436 are connected together and to a bias voltage and the gates of transistors 1432 and 1438 are connected together and to a bias voltage. This is a conventional amplifier structure with an inherent offset voltage in a physical layout.

In order to provide the same amplifier with the same offset and opposite polarity, the layout thereof is changed. The transistors are identical and, therefore, are noted by a "prime" to the reference numeral. In order to invert the polarity of the amplifier, the source/drain path of transistor 1420' is not connected in series with the source/drain path of the corresponding transistor 1422' as it was in amplifier 123. Rather, transistors 1420' and 1428' are connected in series between node 1424 and node 1413'.

Transistor 1426' and transistor 1422' are connected together in series between node 1424 and node 1415'. The gates of transistors 1426' and 1420' are connected to the node 1415', with node 1413' remaining output node. Similarly, the transistor 1430' is not connected in series with transistor 1432'but, rather, the source/drain path of transistor 1430' is connected in series with the source/drain path of transistor 1438' and the transistor 1436' has the source/drain path thereof connected in series with the source/drain path of transistor 1432'. Additionally, the source/drain path of transistor 1412' associated with the negative input node 1404' is connected between node 1408' and the node 1414', with the source/drain path of transistor 1410' associated with the positive input node 1402' connected between the node 1408' and the node 1416'. With the transistors associated with amplifier 132 being identical with respect to the amplifier 123 but connected as shown in FIG. 15, the offset voltage will be equal in magnitude and opposite in polarity and, thus, there will be a minimization of offset voltages.

Although the preferred embodiment has been described in detail, it should be understood that various changes, substitutions and alterations can be made therein without departing from the spirit and scope of the invention as defined by the appended claims.

What is claimed is:

1. A spark gap device for protecting an integrated circuit, comprising:
   a first node for receiving an input signal;
   a second node to be protected;
   a first conductive layer conductively interfaced to said first node and said second node and disposed therebetween; and
   a second conductive layer connected to a sink voltage and separated from said first conductive layer by an insulating layer of a predetermined thickness;
   wherein a portion of said first conductive layer is disposed proximate to said second conductive layer and not overlying said second conductive layer, such that a gap is formed therebetween;
   wherein said first node is separated from said first conductive layer by a resistive device.

2. The spark gap device of claim 1 wherein said resistive device is a distributed resistive device.

3. A spark gap device for protecting an integrated circuit, comprising:
   a first node for receiving an input signal;
   a second node to be protected;
   a first conductive layer conductively interfaced to said first node and said second node and disposed therebetween; and
   a second conductive layer connected to a sink voltage and separated from said first conductive layer by an insulating layer of a predetermined thickness;
   wherein a portion of said first conductive layer is disposed proximate to said second conductive layer and not overlying said second conductive layer, such that a gap is formed therebetween;
   wherein said second conductive layer is separated from said sink voltage by a resistive device.

4. The spark gap device of claim 3 wherein said resistive device is a distributed resistive device.

5. A spark gap device for protecting an integrated circuit, comprising:
   a first node for receiving an input signal;
   a second node to be protected;

a first conductive layer conductively interfaced to said first node said second node and disposed therebetween; and a second conductive layer connected to a sink voltage and separated from said first conductive layer by an insulating layer of a predetermined thickness;

wherein a portion of said first conductive layer is disposed proximate to said second conductive layer and not overlying said second conductive layer, such that a gap is formed therebetween wherein:

said first node is separated from said first conductive layer by a first resistive device; and said second conductive layer is separated from said sink voltage by a second resistive device.

6. The spark gap device of claim 5 wherein said first and second resistive devices are distributed resistive devices.

7. A spark gap device for protecting an integrated circuit, comprising:

a first node for receiving an input signal;

a second node to be protected;

a first conductive layer conductively interfaced to said first node and said second node and disposed therebetween; and a second conductive layer connected to a sink voltage and separated from said first conductive layer by an insulating layer of a predetermined thickness;

wherein a portion of said first conductive layer is disposed proximate to said second conductive layer and not overlying said second conductive layer, such that a gap is formed therebetween; wherein said second conductive layer is fabricated from polycrystalline silicon.

8. The spark gap device of claim 7 wherein said first conductive layer is fabricated from polycrystalline silicon and said insulating layer is comprised of silicon dioxide.

9. A spark gap device for protecting an integrated circuit, comprising:

a first node for receiving an input signal;

a second node to be protected;

a first conductive layer conductively interfaced to said first node and said second node and disposed therebetween; and a second conductive layer connected to a sink voltage and separated from said first conductive layer by an insulating layer of a predetermined thickness;

wherein a portion of said first conductive layer is disposed proximate to said second conductive layer and not overlying said second conductive layer, such that a gap is formed therebetween; wherein the portion of said first conductive layer proximate to said gap and a portion of said second conductive layer proximate to said gap are each shaped with a tapered section that tapers outward to an apex proximate said gap to concentrate the electric field in said gap.

10. An Electrostatic Discharge (ESD) device for protecting an integrated circuit, comprising:

a first node for receiving an input signal;

a second node to be protected;

a first conductive layer conductively disposed between said first node and said second node;

a second conductive layer connected to a sink voltage and separated from said first conductive layer by a first insulating layer of a predetermined thickness; and a plurality of spark gap devices disposed between said first and said second conductive layers, each of said spark gap devices including:

a first protrusion extending from and conductively interfaced with said first conductive layer, a second protrusion extending from and conductively interfaced with said second conductive layer and extending toward said first protrusion and separated from said first protrusion by a second insulating layer of a predetermined thickness, and wherein a portion of said first protrusion is disposed proximate to said second protrusion and not overlying said second protrusion or said second conductive layer, such that a gap is formed therebetween and said gap having a dimension that is greater than the perpendicular distance between the planes in which said first and second conductive layers are disposed.

11. The ESD device of claim 10 wherein said first node is separated from said first conductive layer by a resistive device.

12. The ESD device of claim 11 wherein said resistive device is a distributed resistive device.

13. The ESD device of claim 10 wherein said second conductive layer is separated from said sink voltage by a resistive device.

14. The ESD device of claim 13 wherein said resistive device is a distributed resistive device.

15. The ESD device of claim 10 wherein:

said first node is separated from said first conductive layer by a first resistive device; and said second conductive layer is separated from said sink voltage by a second resistive device.

16. The ESD device of claim 15 wherein said first and second resistive devices are distributed resistive devices.

17. The ESD device of claim 10 wherein said second conductive layer is fabricated from polycrystalline silicon.

18. The ESD device of claim 17 wherein said first conductive layer is fabricated from polycrystalline silicon and said first and second insulating layers are comprised of silicon dioxide.

19. The ESD device of claim 10, wherein each of said first and second protrusions proximate to said gap are each shaped with a tapered section that tapers outward to an apex proximate said gap to concentrate the electric field in said gap.

20. The ESD device of claim 10, wherein said first and second protrusions are fabricated from said first and second conductive layers, respectively, and said first and second insulating layers are fabricated from a common insulating layer.

21. The ESD device of claim 10, and further comprising a series resistive device connected to said second node and operable to be connected to circuitry on the integrated circuit.

22. The ESD circuit of claim 21, wherein said series resistive device comprises a conductive strip having a predetermined resistivity and length to width ratio and separated from said second conductive layer by an third insulating layer having a thickness equal to or greater than said gap.

* * * * *